(12) United States Patent
Choi et al.

(10) Patent No.: US 6,739,039 B2
(45) Date of Patent: May 25, 2004

(54) MANUFACTURING METHOD OF PRINTED CIRCUIT BOARD USING DRY FILM RESIST

(75) Inventors: Jun Hyeak Choi, Suwon (KR); Kook Hyeon Han, Seoul (KR); Jan Hun Kim, Busan (KR)

(73) Assignee: Kolon Industries Inc., Gyunggi-do (KR)

( * ) Notice: Subject to any disclaimer, the term of this patent is extended or adjusted under 35 U.S.C. 154(b) by 0 days.

(21) Appl. No.: 10/020,163

(22) Filed: Dec. 18, 2001

(65) Prior Publication Data

US 2002/0116815 A1 Aug. 29, 2002

(30) Foreign Application Priority Data

Dec. 19, 2000 (KR) ......................................... 2000-78332
Aug. 6, 2001 (KR) ......................................... 2001-47246

(51) Int. Cl.[7] ................................................. H05K 3/00
(52) U.S. Cl. ............................. 29/829; 29/831; 29/846; 29/847; 430/311; 430/328; 430/330
(58) Field of Search .................... 29/829, 831, 846, 29/847; 430/311, 328, 330

(56) References Cited

U.S. PATENT DOCUMENTS

| | | | | |
|---|---|---|---|---|
| 4,528,261 A | * | 7/1985 | Hauser | 430/311 |
| 4,804,575 A | * | 2/1989 | Kohm | 174/259 |
| 4,806,200 A | * | 2/1989 | Larson et al. | 216/101 |
| 5,658,611 A | * | 8/1997 | Ishido et al. | 205/196 |
| 6,026,884 A | * | 2/2000 | Spitko | 100/334 |

* cited by examiner

Primary Examiner—Carl J. Arbes
Assistant Examiner—Tim Phan
(74) Attorney, Agent, or Firm—Birch, Stewart, Kolasch & Birch, LLP

(57) ABSTRACT

Disclosed is a manufacturing method of a circuit of a printed circuit board using a dry film resist in forming a circuit pattern on a copper overlaid laminate as a normal printed circuit board, in which a modification of the manufacturing process can enhance the resolution and fine weldability of the resist to realize a fine structure of the circuit pattern. The method includes: laminating the dry film resist on the top surface of the printed circuit board; exposing the dry film resist to ultraviolet (UV) radiations using a photomask in which a desired circuit pattern is formed; annealing the resulting material of the previous step with infrared (IR) radiations; and removing unexposed areas of the resist by development.

7 Claims, 5 Drawing Sheets

MANUFACTURING METHOD OF PRINTED CIRCUIT BOARD USING DRY FILM RESIST

CROSS REFERENCE TO RELATED DOCUMENT

The present application claims the benefit of Korea Patent Applications: No. 2000-0078332, filed Dec. 19$^{th}$ 2000 and No. 2001-47246, filed Aug. 6$^{th}$ 2001.

BACKGROUND OF THE INVENTION (a) Field of the Invention

The present invention relates to a manufacturing method of a printed circuit board using a dry film resist and, more particularly, to a manufacturing method of a printed circuit board using a dry film resist in forming a circuit pattern on a copper overlaid laminate as a normal printed circuit board, in which a modification of the manufacturing process can enhance the resolution and fine weldability of the resist to realize a minimization of the circuit pattern.

(b) Description of the Related Art

In general, a dry film resist (hereinafter, referred to as "DFR") is used in forming a circuit pattern on a printed circuit board (hereinafter, referred to as "PCB"). The manufacturing method of a PCB using a DFR is schematically shown in FIG. 1.

To form a copper overlaid laminate as a substrate of the, PCB, a pretreatment is performed, in step 10. The pretreatment comprises an outer layer processing step that sequentially includes drilling, deburing and facade, and an inner layer processing step including counter etching or acid rinsing.

Following, the pretreatment, a DFR is laminated on a copper layer of the copper overlaid laminate to form a circuit pattern on the copper overlaid laminate, in step 20. In this lamination step, use is made of a laminator to peel a protective film of the DFR and laminate a resist layer of the DFR on the surface of the copper layer. Typically, lamination is performed under conditions: the lamination rate 0.5 to 3.5 m/min, the temperature 100 to 130° C., the pressure of a heating roller 10 to 90 psi.

Subsequent to the lamination, the PCB is kept for over 15 minutes to stabilize the substrate, in step 30, and the resist layer of the DFR is subjected to exposure using a photomask in which a desired circuit pattern is formed, in step 40. During the exposure, the UV ray irradiated on the photomask causes a photoinitiator contained in the exposed area of the resist to activate polymerization in the resist. The oxygen in the resist is consumed to polymerize active monomers and cause crosslinking and then polymerization with a large amount of monomers. Contrarily, the crosslinking hardly occurs in the unexposed area of the resist.

Subsequently, development is performed to eliminate the unexposed areas of the resist, in step 50. In the development step, an aqueous solution containing 0.8 to 1.2 wt. % of potassium carbonate or sodium carbonate is used as a developing agent for an alkaline-developed DFR. Meanwhile, the unexposed areas of the resist are washed away due to saponification of the carboxylic acids of the binder contained in the developing agent, remaining the cured resist on the surface of the copper layer.

Inner and outer layer processing steps are performed to form a circuit pattern, in step 60. The inner layer processing step includes corrosion and stripping to form a circuit pattern on the substrate, and the outer layer processing step includes etching and solder stripping after plating and tending to form a defined circuit pattern.

When patterning a circuit on the PCB using a DFR, the circuit pattern thus formed may have a line width of 0.1 mm as possible. With the recent tendency of electronic equipment, including miniaturization, light-weight, high performance and high reliability, there is a keen need for densification, high performance and high precision of the PCB used in the electronic equipment as well as a method for reducing the line width of the circuit pattern. Hence, the resolution and fine weldability of the DFR are also required.

To improve the resolution and fine weldability of the DFR, the inventors of this patent have contrived a so-called post-exposure heating process that includes an annealing step between exposure of the resist and elimination of the unexposed areas of the resist, which process has been applied (Korean Patent Application No. 98-14380) and granted (Korean Patent No. 271216).

Now, the post-exposure heating process will be described in detail with reference to FIG. 2.

First, a substrate is subjected to a pretreatment in the same manner as described above with reference to FIG. 1, in step 10. Following the pretreatment, a DFR is laminated on the top surface of the substrate, in step 20, and kept for a while, in step 30. The DFR is then exposed to the UV radiation with a photomask to form a desired circuit pattern, in step 40.

Subsequently, the resulting material is annealed, in step 45. The annealing is performed with a heating roller or a hot air oven, which is known to the skilled in the art. The annealing with a heating roller is performed under conditions that satisfy at least one of the following requirements: using 1 to 3 heating rollers, the temperature of the heating roller 80 to 160° C., the driving rate of the heating roller 0.2 to 5.0 m/min, and the pressure of the heating roller 10 to 90 psi. The annealing with a hot air oven is performed at the oven temperature 80 to 200° C. for 5 to 600 seconds.

Although the post-exposure heating process for improving resolution and fine weldability of the resist may enhance the fundamental properties of the dry film, the use of a hot air oven deteriorates workability and productivity and that of a heating roller requires a strict control of the process because the contamination of the heating roller with foreign materials may increase fixing-related defectives.

SUMMARY OF THE INVENTION

In an attempt to solve the problems with the post-exposure heating process, the inventors of this invention found out that the use of an infrared (IR) drying zone instead of a heating roller or a hot air oven can reduce fixing-related defectives caused by foreign materials during the process and improve the efficiency of production as well as achieve defined objects of the annealing.

It is an object of the present invention to provide a method for reducing fixing-related defectives caused by foreign materials and improving the efficiency of production in performing an annealing step subsequent to exposure in the manufacture of a printed circuit board (PCB) or lead frames using a dry film resist (DFR).

It is another object of the present invention to demonstrate the effect of using a DFR having a predetermined thickness in performing an annealing step subsequent to a so-called post-exposure heating process using a rolling roll, a hot air oven or an IR drying zone.

To achieve the objects of the present invention, there is provided a manufacturing method of a PCB and a lead frame using a DFR that includes pretreatment, lamination, keeping, exposure and development, wherein the manufacturing method further includes a heat drying step performed with an IR drying zone for 5 to 600 seconds between the exposure of the resist and the removal of unexposed areas of the resist.

In another aspect of the present invention, there is provided a manufacturing method of a PCB that includes an annealing step between a step of exposing the resist having a thickness in the following range and a step of moving unexposed areas of the resist:

$$5 \mu m \leq t \leq 100 \mu m$$

where t represents the thickness of a resist layer between base and cover films of the DFR, provided that $20 \mu m \leq t \leq 30$ $\mu m$ is excluded.

Hereinafter, the manufacturing method of the present invention will be described in detail with reference to FIG. 3.

The procedures are performed in the same manner as the conventional manufacturing method that includes pretreatment (step 10), lamination (step 20), keeping (step 30) and exposure (step 40). Subsequently, heat drying is performed with an IR drying zone (step 45').

The heat drying is performed with the IR drying zone 30 to 300 cm long at a temperature of 30 to 150° C. for 5 to 600 seconds, under which conditions heat curing of the resist hardly occurs.

The heat drying conditions may be summarized as follows:

$$30 \text{ cm} \leq L \leq 300 \text{ cm}, 30° \text{ C.} \leq T \leq 150° \text{ C., and } 5 \text{ sec.} \leq t \leq 600 \text{ sec.}$$

where L is the length of the IR drying zone, T the temperature of the drying zone, t the detention time of the IR drying zone.

Under conditions beyond the above range, the resist is not sufficiently annealed as to have enhanced fine weldability and resolution. Also, excessive annealing may lea cause heat curing of the unexposed areas of the resist and hence insufficient development and stripping on the resist during the subsequent development and stripping steps.

The subsequent steps are development (step 50) and inner/outer layer processing (step 60).

The annealing with an IR drying zone in the continuous manufacturing process of a PCB solves the problem of fixing-related defectives that may increase in the annealing step using a heating roller due to contamination of the heating roller as shown in FIG. 2. Such an annealing step with an IR drying zone also increases the drying efficiency than the annealing with a hot air oven, thus reducing the annealing time with a high efficiency and enhancing the properties of the circuit pattern, such as sensitivity, resolution and fine weldability.

On the other hand, the present invention further includes annealing using a heating roller or a hot air oven in a defined thickness range of the resist as well as the above-mentioned annealing using an IR drying zone.

The annealing using a heating roller is performed under conditions that satisfy at least one of the following requirements: using 1 to 3 heating rolls, the temperature of the heating roller 80 to 160° C., the driving rate of the heating roller 0.2 to 5.0 m/min, and the pressure of the heating roller 10 to 90 psi. The annealing with a hot air oven is performed at an oven temperature of 80 to 200° C. for 5 to 600 seconds.

The effect of annealing on the DFR is dependent on the thickness of the resist layer of the DFR. That is, the annealing on a thin film or a thick film remarkably enhances the fundamental properties of the DFR, such as independent thinning, resolution and follow-up ability.

Preferably, the resist layer of the DFR has a thickness of about 5 to 100 $\mu m$, excluding the thickness range of 20 to 30 $\mu m$.

The so-called "thin DFR (Dry Film Resist)" has a resist layer of which the thickness is equal to or greater than 5 $\mu m$ and less than 20 $\mu m$. The DFR having a resist layer that is greater than 30 $\mu m$ and less than or equal to 100 $\mu m$ in thickness is called "thick DFR".

The annealing remarkably enhances the fundamental properties of a thin or thick DFR, such as resolution or fine weldability, and especially increases the follow-up ability of the DFR, which contributes to an increase in the production yield.

Following the annealing step, development and inner/outer layer processing are performed.

DETAILED DESCRIPTION OF THE PREFERRED EMBODIMENTS

Figure 1:
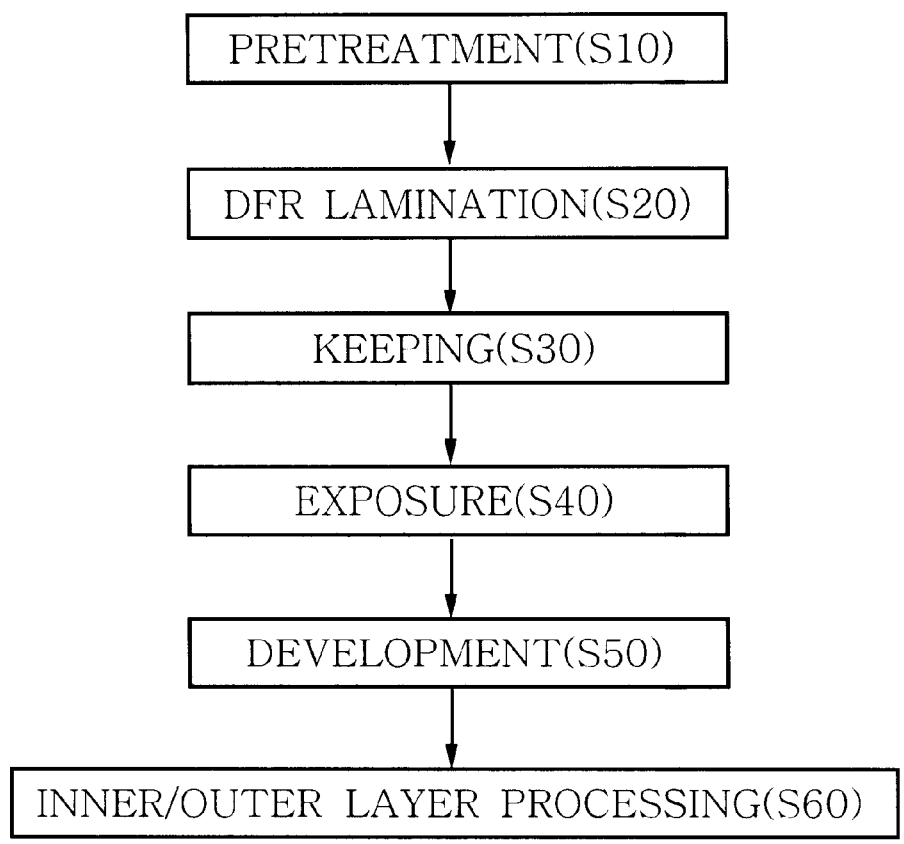
FIG. 1 is a block diagram showing a manufacturing method of a general printed circuit board (PCB)
Figure 2:
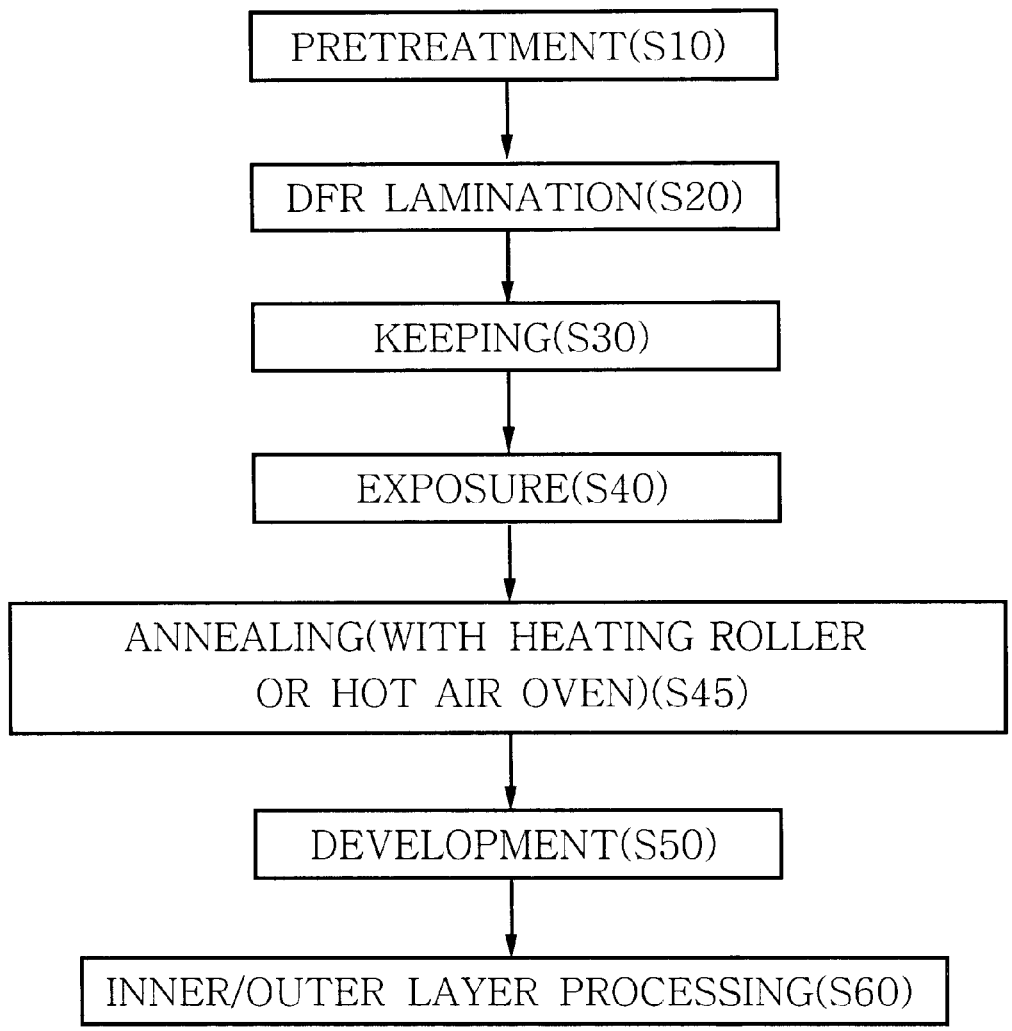
FIG. 2 is a block diagram showing a manufacturing method of a PCB that includes annealing subsequent to exposure.
Figure 3:
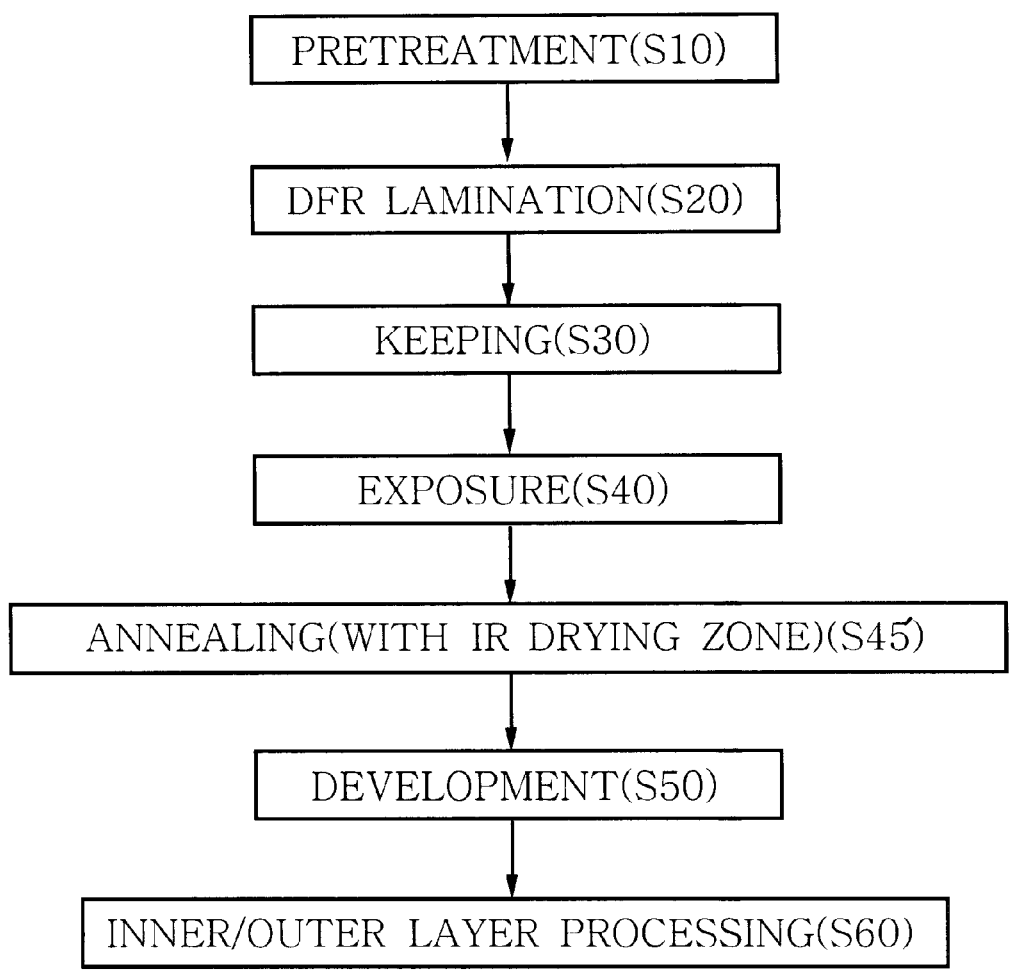
FIG. 3 is a block diagram showing a manufacturing method of a PCB that includes annealing using an infrared (IR) drying zone subsequent to exposure in accordance with the present invention.

Hereinafter, the present invention will be described in detail by way of the following examples, which are not intended to limit the scope of the present invention.

Examples 1 and 2 and Comparative Examples 1 and 2

Dry film resists (DFRs) having a resist composition shown in Table 1 or 2 were laminated on a copper layer overlying a printed circuit board (PCB), and subjected to exposure, annealing and development. Subsequently, the properties of the resists thus cured were measured.

TABLE 1

DFR-A

| | Composition | Content (wt. %) |
|---|---|---|
| Polymer Binder | Polymer Binder A | 50 |
| Photoinitiator | Benzophenone | 2.0 |
| | 4,4'-(bisdiethylamino)benzophenone | 1.0 |
| | Leuco Crystal Violet | 3.0 |
| | Toluene Sulfonate. Monohydrate | 0.5 |
| | Diamond Green GH | 0.5 |
| Photopolymeric Monomer | 9G | 10.0 |
| | APG-400 | 10.0 |
| | BPE-500 | 10.0 |
| Solvent | Methylethyl Ketone | 13.0 |

TABLE 2

DFR-B

| | Composition | Content (wt. %) |
|---|---|---|
| Polymer Binder | Polymer Binder B | 50 |
| Photoinitiator | Benzophenone | 2.0 |
| | 4,4'-(bisdiethylamino)benzophenone | 1.0 |
| | Leuco Crystal Violet | 3.0 |
| | Toluene Sulfonate. Monohydrate | 0.5 |
| | Diamond Green GH | 0.5 |
| Photopolymeric Monomer | 9G | 10.0 |
| | APG-400 | 10.0 |
| | BPE-500 | 10.0 |
| Solvent | Methylethyl Ketone | 13.0 |

In Comparative Examples 1 and 2, DFR-A and DFR-B were independently annealed at 120 to 150° C. for 12 seconds in a hot air oven. The elapsed time from exposure to annealing was 35 seconds.

Instead of the hot air oven, an IR drying zone was used in the annealing step of Examples 1 and 2, in which the length of the IR drying zone was 50 cm, the drying temperature 70 to 90° C., the drying rate 2.5 m/min (the annealing time 12 seconds).

Subsequently, measurements were performed in regard to sensitivity, resolution and fine weldability of the individual resist depending on the thickness of the resist and the amount of light irradiated on the resist. The results are presented in Table 3.

TABLE 3

| | | Comparative Example 1 DFR-A (20 μm thick) Temperature of Hot Air Oven | | | Comparative Example 2 DFR-B (20 μm thick) Temperature of Hot Air Oven | | | Example 1 DFR-A (20 μm thick) Temperature of IR Drying Zone | | | Example 2 DFR-B (20 μm thick) Temperature of IR Drying Zone | | |
|---|---|---|---|---|---|---|---|---|---|---|---|---|---|
| (1) | | No Heat | 120 °C. | 150 °C. | No Heat | 120 °C. | 150 °C. | No Heat | 50 °C. | 80 °C. | No Heat | 50 °C. | 80 °C. |
| (2) | 10 | 5.0 | 4.3 | 4.9 | 5.0 | — | — | 5.0 | 5.0 | 5.0 | 5.0 | 5.0 | 4.0 |
| | 15 | 6.0 | — | — | 6.0 | 4.0 | 4.2 | 6.0 | 5.8 | 5.7 | 6.0 | 5.8 | 5.2 |
| | 20 | 7.0 | 7.0 | 6.9 | 7.0 | — | — | 7.0 | 7.0 | 6.8 | 7.0 | 7.0 | 6.5 |
| | 25 | 7.5 | — | — | 7.5 | 6.4 | 6.2 | 7.5 | 7.3 | 7.2 | 7.5 | 7.5 | 7.0 |
| | 30 | 8.0 | — | — | 8.0 | — | — | 8.0 | 8.0 | 7.8 | 8.0 | 7.8 | 7.5 |
| | 40 | — | — | — | 9.0 | — | — | — | 8.5 | 7.8 | 9.0 | — | 7.5 |
| (3) | 10 | 13 | 11 | 11 | 14 | — | — | 13 | 11 | 11 | 14 | 10 | 10 |
| | 15 | 16 | — | — | 15 | 13 | 11 | 16 | 11 | — | 15 | 10 | 10 |
| | 20 | 20 | 16 | 17 | 19 | — | — | 20 | 13 | 15 | 19 | 14 | 14 |
| | 25 | 22 | — | — | 21 | 15 | 15 | 22 | 15 | 15 | 21 | 14 | 14 |
| | 30 | 24 | — | — | 22 | — | — | 24 | 15 | 15 | 22 | 16 | 14 |
| | 40 | — | — | — | 24 | — | — | — | 15 | 15 | 24 | 16 | 14 |
| (4) | 10 | 26 | 25 | 25 | 27 | — | — | 26 | 24 | 22 | 27 | 22 | 22 |
| | 15 | 21 | — | 19 | 23 | 23 | 21 | 21 | 18 | 18 | 23 | 20 | 18 |
| | 20 | 20 | 19 | — | 20 | — | 16 | 20 | 18 | 18 | 20 | 18 | 18 |
| | 25 | 18 | — | — | 18 | 16 | — | 18 | 18 | 16 | 18 | 18 | 18 |
| | 30 | 16 | — | — | 17 | — | — | 16 | 14 | 14 | 17 | 18 | 18 |
| | 40 | — | — | — | — | — | — | — | 14 | 14 | — | 16 | 18 |
| (5) | | 12 | | 11.5 | 14.5 | | 14 | 12 | | 12 | 11.5 | 14.5 | 14.5 | 14 |

Note)
(1): Amount of light (mJ/cm²) irradiated on the resist under artwork.
(2): Sensitivity measured with a Stouffer 21 step tablet.
(3): Resolution (μm) measured with a space between circuit lines divided into 1:1.
(4): Fine weldability (μm)
(5): Minimum development time (hr.)
* Development conditions of DFR: developing solution containing 1 wt. % of $Na_2CO_3$, temperature 30° C., spray pressure 1.5 kg/cm², rupture point 50%.

As can be seen from Table 3, annealing with an IR drying zone took a shorter drying time than annealing with a hot air oven and had more advantages in that the circuit pattern thus formed had excellent properties, such as sensitivity, resolution and fine weldability, and was favorable for continuous process. Also, the properties of the resist, including sensitivity, resolution and fine weldability could be enhanced without a change in the minimum development rate when the temperature of the IR drying zone.

Example 3

A DFR having a resist composition shown in Table 4 was laminated on a copper layer overlying a PCB, and subjected to exposure, annealing and development. Subsequently, the properties of the resist thus cured were measured.

A heating roller, a hot air oven or an IR drying zone was used in the annealing step. Measurements were then performed in regard to sensitivity, resolution and fine weldability of the DFR depending on the thickness of the DFR and the amount of light irradiated on the DFR. The results are presented in Table 5. The annealing step using a heating roller was performed under the conditions: the temperature of the heating roller 120° C., the pressure 80 psi, the annealing rate 2.5 m/min, using a two-stage roller. The annealing step using a hot air oven was performed at 150° C. for 12 seconds. The annealing step using an IR drying zone was performed under the conditions: the annealing temperature 120° C., the annealing rate 2.5 m/min, the length of the IR drying zone 100 cm.

TABLE 4

DFR-C

| Composition | | Content (wt. %) |
|---|---|---|
| Polymer Binder | Polymer Binder C | 48 |
| Photoinitiator | Benzophenone | 2.0 |
| | 4,4'-(bisdiethylamino) benzophenone | 3.0 |
| | Leuco Crystal Violet | 3.0 |
| | Toluene Sulfonate. Monohydrate | 0.5 |
| | Diamond Green GH | 0.5 |
| Photopolymeric Monomer | 9G | 15.0 |
| | APG-400 | 5.0 |
| | BPE-500 | 10.0 |
| Solvent | Methylethyl Ketone | 13.0 |

TABLE 5

| | | DFR-C (10 μm thick) Annealing Method | | | | DFR-C (20 μm thick) Annealing Method | | | | DFR-C (30 μm thick) Annealing Method | | | |
|---|---|---|---|---|---|---|---|---|---|---|---|---|---|
| | (1) | I | II | III | IV | I | II | III | IV | I | II | III | IV |
| (2) | 20 | 7.0 | 6.7 | 6.8 | 6.8 | 7.0 | 6.8 | 6.7 | 6.5 | 7.0 | 6.5 | 6.7 | 6.5 |
| | 30 | 8.0 | 7.7 | 7.5 | 7.7 | 7.0 | 7.7 | 7.7 | 7.7 | 8.0 | 7.7 | 6.5 | 7.4 |
| | 40 | 9.0 | 8.5 | 8.5 | 8.7 | 9.0 | 8.7 | 8.6 | 8.5 | 9.0 | 8.5 | 8.7 | 8.5 |
| | 50 | 10.0 | 9.8 | 9.5 | 9.7 | 10.0 | 9.7 | 9.7 | 9.7 | 10.0 | 9.5 | 9.7 | 9.5 |
| (3) | 20 | 21 | 17 | 16 | 15 | 26 | 24 | 24 | 22 | 28 | 27 | 26 | 24 |
| | 30 | 25 | 20 | 20 | 18 | 30 | 28 | 27 | 27 | 35 | 33 | 33 | 31 |
| | 40 | 30 | 24 | 24 | 23 | 34 | 31 | 31 | 30 | 42 | 40 | 40 | 39 |
| | 50 | 34 | 29 | 30 | 28 | 40 | 38 | 36 | 36 | 45 | 43 | 42 | 42 |
| (4) | 20 | 30 | 20 | 23 | 24 | 35 | 33 | 32 | 31 | 37 | 34 | 34 | 33 |
| | 30 | 25 | 18 | 20 | 20 | 30 | 28 | 28 | 26 | 35 | 32 | 33 | 32 |
| | 40 | 20 | 13 | 18 | 20 | 25 | 23 | 23 | 21 | 30 | 28 | 28 | 27 |
| | 50 | 20 | 12 | 16 | 18 | 25 | 23 | 22 | 20 | 27 | 27 | 25 | 25 |

Note)
(1): Amount of light (mJ/cm²) used in exposure under artwork, i.e., the amount of light irradiated on the DFR.
(2): Sensitivity measured with a Stouffer 21 step tablet.
(3): Resolution (μm) measured with a space between circuit lines divided into 1:1.
• The thickness of the resist means that of a resist layer between base and cover films of the DFR.
(4): Fine weldability (μm)
• Method I: Without annealing after exposure.
• Method II: Annealing with a heating roller.
• Method III: Annealing with a hot air oven.
• Method IV: Annealing with an IR drying zone.
• Lamination conditions of DFR: HAKUTO MaCH 610i, temperature 115° C., pressure 4 kg/cm², rate 2.5 m/min, temperature of preheater 120° C.
• Exposure conditions of DFR: using an OB7120 parallel light exposure device supplied by Perkin-Elmer.
• Development conditions of DFR: developing solution containing 1 wt. % of Na₂CO₃, temperature 30° C., spray pressure 1.5 kg/cm², rupture point 50%.

As can be seen from Table 5, the annealing had the most remarkable effect on the DFR-C (10 μm) composition to enhance resolution and independent thinning. In particular, when using a heating roller (Method II), independent thinning was most enhanced in the DFR-C (μm) composition.

Namely, annealing with a heating roller enhanced the follow-up ability of the thin DFR-C (μm) to improve fine weldability, which was more prominently enhanced in the relatively thick DFR-C (μm).

To demonstrate these results, a comparison of enhanced properties was made between Method I (without annealing) and Method II (annealing with a healing roll). The results are presented in Table 6.

TABLE 6

| (1) | DFR-A (10 μm thick) Annealing Method | | | DFR-A (20 μm thick) Annealing Method | | | DFR-A (30 μm thick) Annealing Method | | |
|---|---|---|---|---|---|---|---|---|---|
|  | I | II | Δ I - II | I | II | Δ I - II | I | II | Δ I - II |
| (2) 20 | 30 | 20 | 10 | 35 | 33 | 2 | 37 | 34 | 3 |
| 30 | 25 | 18 | 7 | 30 | 28 | 2 | 35 | 32 | 3 |
| 40 | 20 | 13 | 7 | 25 | 23 | 2 | 30 | 28 | 2 |
| 50 | 20 | 12 | 8 | 25 | 23 | 2 | 27 | 27 | 0 |

Note)
(1): Amount of light (mJ/cm$^2$) used in exposure under artwork
(4): Fine weldability (μm)

Next, the effect of the annealing on the thick DFRs was evaluated in the same manner as described above. The results are presented in Table 7.

TABLE 7

| (1) | DFR-C (30 μm thick) Annealing Method | | | | DFR-C (50 μm thick) Annealing Method | | | | DFR-C (70 μm thick) Annealing Method | | | |
|---|---|---|---|---|---|---|---|---|---|---|---|---|
|  | I | II | III | IV | I | II | III | IV | I | II | III | IV |
| (2) 30 | 8.0 | 7.7 | 7.5 | 7.4 | 8.0 | 7.6 | 7.9 | 7.5 | 8.0 | 7.7 | 7.5 | 7.7 |
| 40 | 9.0 | 8.5 | 8.7 | 8.5 | 9.0 | 8.8 | 8.8 | 8.5 | 9.0 | 8.6 | 8.7 | 8.5 |
| 50 | 10.0 | 9.5 | 9.7 | 9.5 | 10.0 | 9.5 | 9.7 | 9.5 | 10.0 | 9.6 | 9.8 | 9.5 |
| (3) 30 | 35 | 33 | 33 | 31 | 50 | 43 | 42 | 45 | 60 | 57 | 57 | 56 |
| 40 | 42 | 40 | 40 | 39 | 55 | 53 | 53 | 51 | 65 | 63 | 63 | 59 |
| 50 | 45 | 43 | 42 | 42 | 60 | 57 | 55 | 54 | 70 | 68 | 64 | 64 |
| (4) 30 | 35 | 32 | 33 | 32 | 40 | 35 | 38 | 36 | 42 | 38 | 40 | 38 |
| 40 | 30 | 28 | 28 | 27 | 35 | 32 | 34 | 30 | 35 | 31 | 33 | 30 |
| 50 | 27 | 27 | 25 | 25 | 30 | 27 | 27 | 26 | 30 | 27 | 29 | 26 |

Note)
(1): Amount of light (mJ/cm$^2$) used in exposure under artwork, i.e., the amount of light irradiated on the DFR.
(2): Sensitivity measured with a Stouffer 21 step tablet.
(3): Resolution (μm) measured with a space between circuit lines divided into 1:1.
• The thickness of the resist means that of a resist layer between base and cover films of the DFR.
(4): Fine weldability (μm)
• Method I: Without annealing after exposure.
• Method II: Annealing with a heating roller.
• Method III: Annealing with a hot air oven.
• Method IV: Annealing with an IR drying zone.
• Lamination conditions of DFR: HAKUTO MaCH 610i, temperature 115° C., pressure 4 kg/cm$^2$, rate 2.5 m/min, temperature of preheater 120° C.
• Exposure conditions of DFR: using an OB7120 parallel light exposure device supplied by Perkin-Elmer.
• Development conditions of DFR: developing solution containing 1 wt. % of Na$_2$CO$_3$, temperature 30° C., spray pressure 1.5 kg/cm$^2$, rupture point 50%.

As can be seen from Table 7, the thick DFRs subjected to annealing were enhanced in general properties, such as resolution and fine weldability, which were inferior to those of the thin DFRs. Contrarily, the follow-up ability, essential to the production yield in the manufacture of PCBs, was much remarkably enhanced after the annealing step.

The thick DFRs were evaluated in regard to the follow-up ability and the results are presented in Table 8.

Figure 4:
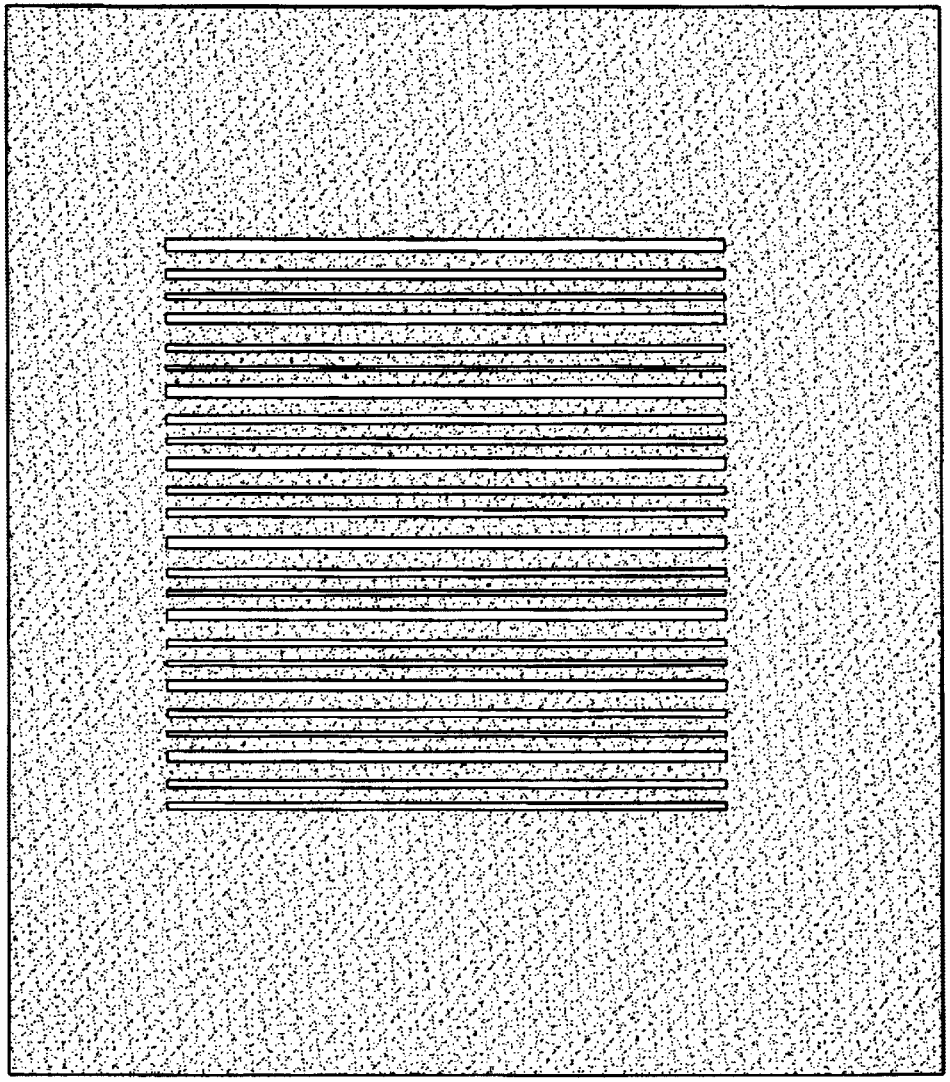
FIG. 4 is a test artwork image for forming a trance on a copper-clad laminate (CCL) in order to evaluate the follow-up ability of a DFR.
Figure 5:
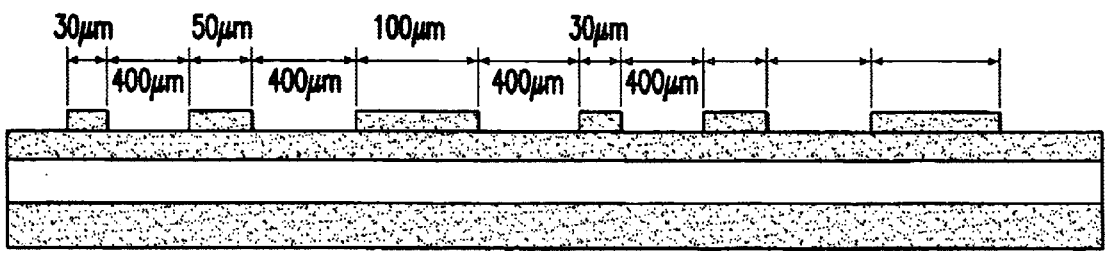
FIG. 5 is a test artwork image after formation of a trace on the surface of the CCL under the artwork shown in FIG. 4.
Figure 6:
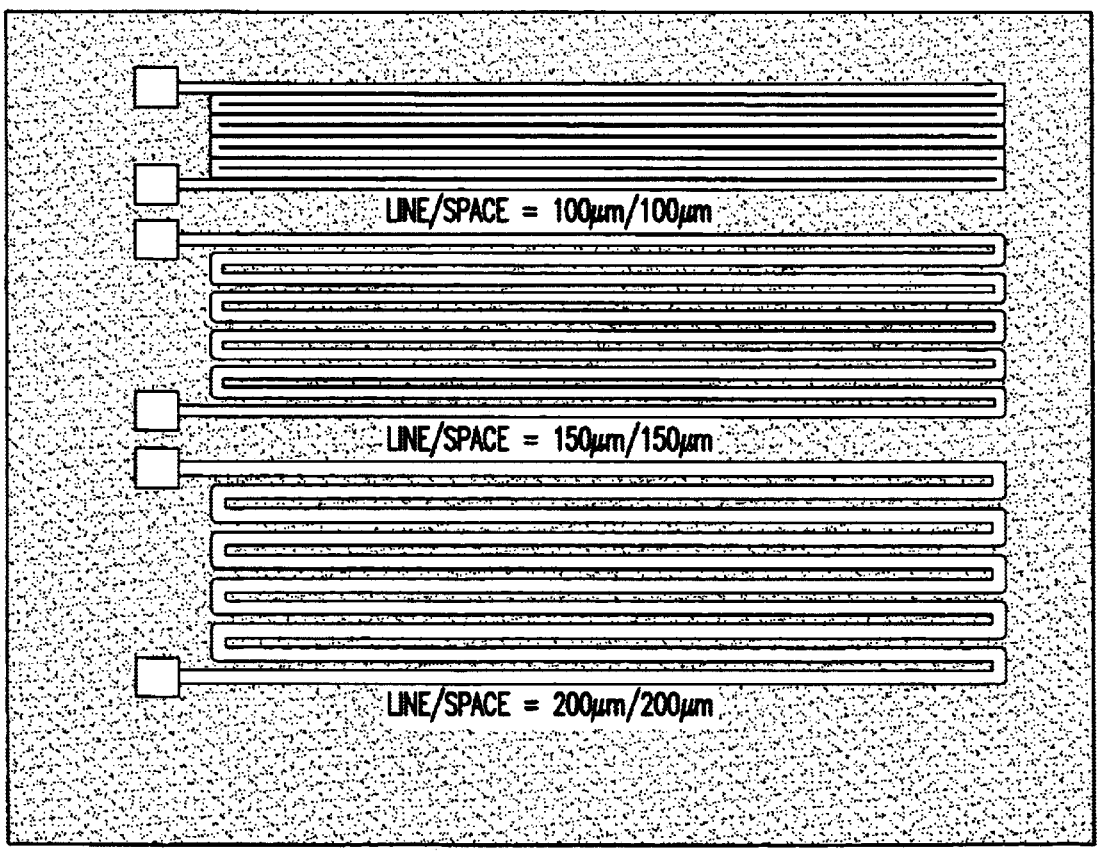
FIG. 6 is a test artwork image for forming a circuit pattern in the vertical direction on the CCL.

The follow-up ability was measured by the trace method. More specifically, under the artwork shown in FIG. 4, the surface of a copper-clad laminate (CCL) was embossed with a trace shown in FIG. 4 using a soft etching process and a DFR was laminated on the CCL in the vertical direction. Following the lamination, a circuit as shown in FIG. 6 was formed in the perpendicular direction to the trace and the number of opens in the circuit (open defectives) was counted. The trace had a depth of 10±1 μm or 25±2 μm. The depth of the trace was measured with a laser scanning microscope.

TABLE 8

|  | Depth of Trace (μm) | Circuit Width (μm) | DFR-C (30 μm thick) Annealing Method | | | DFR-C (50 μm thick) Annealing Method | | | DFR-C (70 μm thick) Annealing Method | | |
|---|---|---|---|---|---|---|---|---|---|---|---|
|  |  |  | I | II | IV | I | II | IV | I | II | IV |
| Yield (%) | 10 | 100 | 65 | 62 | 66 | 88 | 98 | 87 | 94 | 100 | 94 |
|  |  | 150 | 68 | 69 | 67 | 92 | 99 | 92 | 95 | 100 | 95 |
|  |  | 200 | 70 | 73 | 69 | 90 | 99 | 90 | 95 | 100 | 95 |
|  | 25 | 100 | 12 | 2 | 10 | 83 | 95 | 83 | 93 | 99 | 92 |
|  |  | 150 | 14 | 5 | 17 | 85 | 93 | 82 | 92 | 100 | 93 |
|  |  | 200 | 10 | 3 | 13 | 88 | 9 | 8 | 93 | 100 | 93 |
| Count of Open Defectives (x/500) | 10 | 100 | 175 | 190 | 170 | 60 | 10 | 65 | 30 | 0 | 30 |
|  |  | 150 | 160 | 155 | 165 | 40 | 5 | 40 | 25 | 0 | 25 |
|  |  | 200 | 150 | 135 | 155 | 50 | 5 | 50 | 25 | 0 | 25 |
|  | 25 | 100 | 440 | 490 | 450 | 85 | 25 | 85 | 35 | 5 | 40 |
|  |  | 150 | 430 | 475 | 415 | 75 | 35 | 90 | 40 | 0 | 35 |
|  |  | 200 | 450 | 485 | 435 | 60 | 15 | 65 | 35 | 0 | 35 |

Note)
• The thickness of the resist means that of a resist layer between base and cover films of the DFR.
• Method I: Without annealing after exposure.
• Method II: Annealing with a heating roller.
• Method IV: Annealing with an IR drying zone.
• Follow-up ability is measured by the trace method, in which a circuit (line/space = 1/1) is etched (rupture point 70%) and stripped to count the number of open defectives and compare the yields.
• The thickness of the CCL is 1 mm and the copper film is 2 oz.
• Lamination conditions of DFR: HAKUTO MaCH 610i, temperature 115° C., pressure 4 kg/cm$^2$, rate 2.5 m/min, temperature of preheater 120° C.
• Exposure conditions of DFR: using an OB7120 parallel light exposure device supplied by Perkin-Elmer.
• Development conditions of DFR: developing solution containing 1 wt. % of Na$_2$CO$_3$, temperature 30° C., spray pressure 1.5 kg/cm$^2$, rupture point 50%.
• Etching conditions: Copper chloride hydrogen peroxide system, rupture point 70%, ORP 450 mV.

As described above, a heat drying performed with an IR drying zone between exposure and development allows an effective annealing process with a high drying efficiency in a short time, enhances the properties of circuits such as sensitivity, resolution and fine weldability, and reduces a problem of fixing-related defectives that may occur in the conventional heat drying using a hot air oven or a heating roller due to contamination of the heating roller. As for a thin DFR, i.e., a film with a resist layer of which the thickness is equal to or greater than 5 μm and less than 20 μm, the annealing performed between exposure and development remarkably enhances the resolution and independent thinning of the resist. For a thick DFR having a resist layer that is greater than 30 μm and less than or equal to 100 μm in thickness, the annealing between exposure and development enhances the resolution or fine weldability of the resist, and especially the follow-up ability of the DFR, which contributes to an increase in the production yield.

What is claimed is:

1. A manufacturing method of a printed circuit board using a dry film resist, comprising the steps of sequentially:
   laminating a dry film resist on a printed circuit board;
   exposing said dry film resist to UV radiation in the presence of a photo mask;
   annealing said dry film resist subsequent to said UV radiation curing step; and
   developing said dry film resist and removing unexposed areas of said resist,
   wherein said resist has a thickness defined by the relationship 5 μm≦t≦100 μm wherein "t" represents the thickness of a resist layer between base and cover films of the dry film resist, provided that 20 μm≦t≦30 μm is excluded.

2. The manufacturing method as claimed in claim 1, wherein the annealing step is performed with a heated roller or a hot air oven.

3. The manufacturing method as claimed in claim 2, wherein the annealing step using a heated roller is performed under conditions satisfying at least one of using 1 to 5 heating rollers, a temperature of the heating roller 30 to 160° C., a driving rate of the heating roller 0.2 to 5.0 m/min or a pressure of the heating roller 10 to 90 psi.

4. The manufacturing method as claimed in claim 2, wherein the annealing step using a hot air oven is performed under conditions satisfying at least one of a temperature 30 to 200° C. or an annealing time 5 to 600 seconds.

5. The manufacturing method as claimed in claim 1, wherein the annealing step is performed in an infrared drying zone.

6. The manufacturing method as claimed in claim 5, wherein the annealing step using an infrared drying zone is performed under conditions satisfying at least one of a length of the infrared drying zone 30 to 300 cm, a temperature 30 to 150° C. or a detention time of the infrared drying zone 5 to 600 seconds.

7. A method for fabricating a printed circuit board using a dry film photoresist, comprising the steps of
   laminating a dry film resist on a printed circuit board;
   exposing said dry film resist to UV radiation in the presence of a photo mask;
   annealing said dry film resist subsequent to said UV radiation curing step by means of infrared irradiation; and
   developing said dry film resist and removing unexposed areas of said resist,
   said infrared annealing process being performed at 30 to 150° C. for 5 to 600 seconds in an infrared drying zone having a length of 30 to 300 cm.

* * * * *